(12) United States Patent
Nötzold

(10) Patent No.: US 8,934,207 B2
(45) Date of Patent: Jan. 13, 2015

(54) PROTECTIVE CIRCUIT AND AUTOMATION COMPONENT

(71) Applicant: Siemens Aktiengesellschaft, Munich (DE)

(72) Inventor: Thomas Nötzold, Bernsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 150 days.

(21) Appl. No.: 13/771,847

(22) Filed: Feb. 20, 2013

(65) Prior Publication Data

US 2013/0215546 A1 Aug. 22, 2013

(30) Foreign Application Priority Data

Feb. 21, 2012 (EP) .................................... 12156353

(51) Int. Cl.
*H02H 9/00* (2006.01)
*H02H 3/20* (2006.01)
*H03K 17/08* (2006.01)
*H03K 19/003* (2006.01)

(52) U.S. Cl.
CPC ................. *H02H 3/20* (2013.01); *H03K 17/08* (2013.01); *H03K 19/00384* (2013.01)
USPC ....................................................... 361/91.5

(58) Field of Classification Search
USPC ......................................................... 361/91.5
See application file for complete search history.

(56) References Cited

U.S. PATENT DOCUMENTS

| 4,573,970 | A | * | 3/1986 | Wagner | 604/115 |
| 6,867,640 | B2 | * | 3/2005 | Scott et al. | 327/541 |
| 8,405,942 | B2 | * | 3/2013 | Tailliet | 361/56 |
| 2008/0084642 | A1 | | 4/2008 | Kato et al. | |

FOREIGN PATENT DOCUMENTS

WO WO 94/29961 12/1994
WO WO 2010/038107 4/2010

\* cited by examiner

*Primary Examiner* — Stephen W Jackson
(74) *Attorney, Agent, or Firm* — Cozen O'Connor

(57) ABSTRACT

A protective circuit for protecting an input or an output of an electrical apparatus against an overvoltage, wherein a series circuit is arranged at the input or the output, the series circuit includes a first transistor and a second transistor, each transistor comprises a gate terminal, a drain terminal and a source terminal, and the drain terminal of the first transistor is connected to a first terminal point and the source terminal of the second transistor is connected to the input or the output and the source terminal of the first transistor is connected to the drain terminal of the second transistor. In addition, the gate terminal of the first transistor is connected via a first resistor to a first pole of a voltage source and the gate terminal of the second transistor is connected via a second resistor to a second pole of the voltage source.

4 Claims, 1 Drawing Sheet

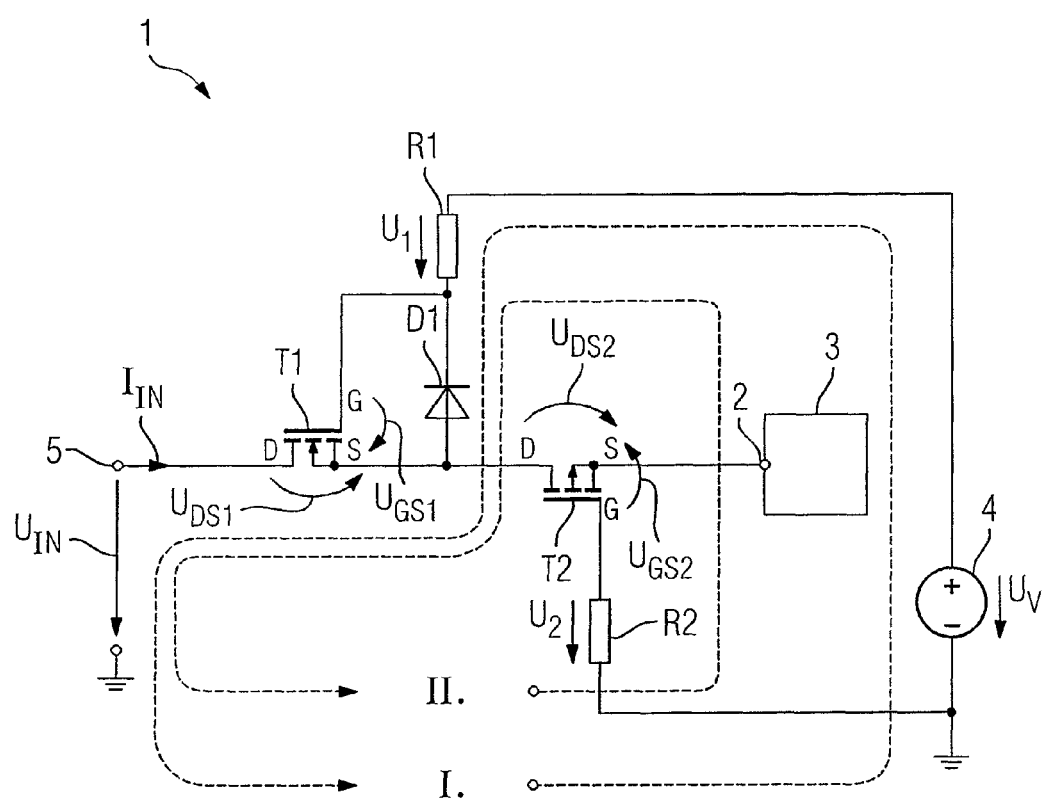

PROTECTIVE CIRCUIT AND AUTOMATION COMPONENT

BACKGROUND OF THE INVENTION

1. Field of the Invention

The invention relates to a protective circuit for protecting an input or an output of an electrical apparatus from an overvoltage.

The invention further relates to an automation component having an electrical apparatus for automating industrial processes, which includes an input or output channel.

2. Description of the Related Art

Protective circuits for protection against electrical circuit parts of an electrical apparatus are already known. One of the most frequent, currently known protective circuits consists of two diodes, which are connected on the one hand to the input against a positive potential and on the other hand to the input against a negative potential. This circuit is known to the person skilled in the art as a "clamping" diode circuit, and it is used to limit the voltage to a positive and to a negative voltage. To this end, a first diode rests with its anode on the input to be protected and a second diode rests with its cathode on the input to be protected. A resistor is also in series with the input to be protected.

This protective circuit is disadvantageous in that the series resistor introduced into the signal path of the input is generally highly resistive, which has an unfavorable effect on signal currents to be detected across the input.

SUMMARY OF THE INVENTION

It is therefore an object of the present invention to provide a protective circuit, which can dispense with a highly resistive series resistor in the signal path.

This and other objects and advantages are achieved in accordance with the invention by a protective circuit for protecting an input or an output of an electrical apparatus from an overvoltage in which a series circuit is arranged on the input or the output, where the series circuit includes a first transistor and a second transistor. The first transistor comprises an n-channel field effect transistor and the second transistor comprises a p-channel field effect transistor, where each of the transistors comprises a gate terminal, a drain terminal and a source terminal, and where the drain terminal of the first transistor is connected to a first terminal point and the source terminal of the second transistor is connected to the input or the output and the source terminal of the first transistor is connected to the drain terminal of the second transistor. The gate terminal of the first transistor is also connected via a first resistor to a first pole of a voltage source and the gate terminal of the second transistor is connected via a second resistor to a second pole of the voltage source. With this solution, two complementary MOSFET transistors are, for instance, introduced in series into a signal line of the input. The transistors are placed on a voltage to be accordingly limited by way of their respective gate terminal. The gate terminal of the n-channel transistor is advantageously applied to the positive voltage to be limited and the gate terminal of the p-channel transistor is applied to the negative voltage to be limited. A gate source threshold voltage of the respective transistor is preferably to be applied to the voltage to be limited to avoid limitation of the actual useful signal.

In an advantageous embodiment, the protective circuit comprises a diode on the gate terminal and the source terminal of the first transistor, which is connected in parallel with the gate terminal and the source terminal. If a negative overvoltage exceeds a maximum permissible gate source voltage of the n-channel transistor, for instance, the gate source voltage is limited with a Z-diode, for instance.

Particularly where electrical apparatuses or electrical circuit parts of a module are used in automation technology, it is necessary to protect corresponding inputs or outputs of automation components from over-voltages. For instance, interferences, such as over-voltages, coupling into signal lines via power lines can occur in an industrial process on account of motors powered with a high current. To ensure that these coupled-in interferences and/or over-voltages do not damage the automation components, it is advantageous if an automation component is provided with an electrical apparatus for automating industrial processes including an input or output channel such that a protective circuit is arranged upstream of the input or output channel to protect against over-voltages.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment, where an input protective circuit with complementary MOSFET transistors is shown in the FIGURE.

DETAILED DESCRIPTION OF THE PREFERRED EMBODIMENTS

According to the FIGURE, a protective circuit 1 is established to protect an input 2 of an electrical apparatus 3 from an overvoltage as follows. A series circuit is arranged at the input 2, where the series circuit includes a first transistor T1 and a second transistor T2. Here, the first transistor T1 is configured as an n-channel MOSFET and the second transistor T2 is configured as a p-channel MOSFET.

Each of the two transistors T1, T2 comprises a gate terminal G, a drain terminal D and a source terminal S. The drain terminal D of the first transistor T1 is connected to a first terminal point 5 and the source terminal S of the second transistor T2 is connected to the input 2.

The first terminal point 5 is used in this example as an elongated input at which useful signals, such as from an industrial process from sensors, can be applied. The actual protective circuit 1 is arranged between the first terminal point 5 and the input 2. The source terminal S of the first transistor T1 is connected to the drain terminal D of the second transistor T2. The gate terminal G of the first transistor T1 is connected via a first resistor R1 to a first pole + of a voltage source 4 and the gate terminal G of the second transistor T2 is connected via a second resistor T2 to a second pole − of the voltage source 4.

An input current $I_{IN}$ can flow across the first terminal point 5 via the protective circuit 1 to the actual input 2 of the electrical apparatus 3. The voltage source 4 provides a supply voltage $U_V$.

The following voltage drops are entered at the resistors R1, R2 and the transistors T1, T2. A first voltage $U_1$ drops at the first resistor T1. A second voltage $U_2$ drops at the second resistor R2, a gate source voltage $U_{GS1}$ drops across the gate terminal G and the source terminal S of the first transistor T1, a drain source voltage $U_{DS1}$ drops across the drain terminal D and the source terminal S of the first transistor T1, a gate source voltage $U_{GS2}$ drops across the gate terminal G and the source terminal S of the second transistor T2, a drain source voltage $U_{DS2}$ drops across the drain terminal D and the source terminal S, as input voltage $U_{IN}$, the input voltage $U_{IN}$ is grounded at the first terminal point 5.

A first voltage mesh I is produced
I. Mesh $$-U_V + U_1 + U_{GS1} - U_{DS1} + U_{IN} = 0$$

with an overvoltage of, e.g., +30V $$U_{GS1} = U_V - U_1 + U_{DS1} - U_{IN}$$
$$= 5\text{ V} - U_1 + U_{DS1} - 30\text{ V}$$
$$= -U_1 + U_{DS1} - 25\text{ V}$$

Two instances of overvoltage limitation result:
1st Instance: Overvoltage Limitation $$-U_V + U_1 + U_{GS1} - U_{DS1} + U_{IN} = 0$$

the gate source voltage $U_{GS1}$ is now allocated the cut-off voltage U-threshold, so that the voltage $U_1$ becomes zero and the voltage $U_{DS1}$ likewise becomes zero: therefore $U_{IN} - U_V - U_{GS1-Threshold}$, remains, which represents a maximum input voltage for operation of the apparatus. With a voltage that lies above the maximum input voltage, the n-channel Mosfet cuts off and therefore limits the input voltage and the input current.
2nd Instance: Negative Overvoltage Limitation $$-U_2 + U_{GS2} + U_{DS2} - U_{DS1} + U_{IN} = 0$$

results with a second voltage mesh II.

The Gate source voltage $U_{GS2}$ is now assigned the cut-off voltage U-threshold so that the voltage $U_2$ becomes zero and the voltages $U_{DS2} = U_{DS1}$ likewise become zero. $U_{IN} = U_{GS2}$ applies, which represents a maximum negative input voltage for operation of the apparatus.

With a voltage below this voltage, the p-channel MOSFET cuts off, and therefore limits the input voltage and the input current.

The afore-cited principle also functions when both transistors are replaced.

$$U_{GS1} = -U_1 - 25\text{V}$$

The two resistors R1 and R2 are each used as gate series resistors and correspondingly provide the voltages to be limited.

Diode D1 is only necessary if the input voltage $U_{IN}$ is so low that the maximum gate source voltage $U_{GS1}$ of the first transistor is exceeded, which would result in the first transistor being destroyed.

The following advantages result with the protective circuit 1. Unlike in the prior art (protective circuit with clamping diodes), the series resistor introduced into the signal path is significantly smaller than the series resistor of the protective circuit with the clamping diodes. In a normal operating state, the flow resistance of the two transistors amounts to a value that lies in a two-digit ohm range, and can additionally be further reduced when selecting the corresponding transistors. This is advantageous in that in the event of useful signals conducting current, such as in constant current outputs in RTD modules for resistance temperature detectors or current inputs and outputs, no significant current discharge to components of the protective circuit occurs on account of the protective measure proposed here. Furthermore, the parasitic currents flowing in voltage inputs do not generate a significant drop in voltage and therefore do not have an influence on the measurement signal.

A further advantage is that a possibly occurring power loss in the event of an overvoltage is very low on the protective circuit. With a MOSFET, in the case of overcurrents, current flows through the protective circuit are prevented by their very highly resistive switching state. Accordingly, barely any power loss occurs within the protective circuit and the circuit subsequently to be protected is also protected from excessively high voltages and currents.

The gate terminals G in MOSFETs are generally very highly resistive. Consequently, there is no falsification of a useful signal in the operating state, such as an automation component by the protective circuit 1.

If the protective circuit 1 is used in an automation component, destruction/damage/premature damage of a module electronics disposed in the automation component can be prevented. The afore-cited destruction/damage or premature damages can occur as a result of system errors, such as faulty wiring, incorrect use, or EMC radiation.

The protective circuit can likewise be used independently of the signal direction in symmetrical supply voltages and in inputs and outputs.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A protective circuit for protecting one of an input and an output of an electrical apparatus from an overvoltage, comprising:
   a series circuit arranged at one of the input and the output, the series circuit including:
   a first transistor and a second transistor, the first transistor being configured as an n-channel field effect transistor and the second transistor being configured as a p-channel field effect transistor, each of the first and second transistors comprising a gate terminal, a drain terminal and a source terminal;
   wherein the drain terminal of the first transistor is connected to a first terminal point, the source terminal of the second transistor is connected to one of the input and the output, and the source terminal of the first transistor is connected to the drain terminal of the second transistor; and
   wherein the gate terminal of the first transistor is connected via a first resistor to a first pole of a voltage source and the gate connection of the second transistor is connected via a second resistor to a second pole of the voltage source.

2. The protective circuit as claimed in claim 1, further comprising a diode connected to the gate terminal and the source terminal of the first transistor.

3. The protective circuit as claimed in claim 2, wherein the diode comprises a Z-diode having a cathode connected to the gate terminal of the first transistor.

4. An automation component having an electrical apparatus for automating industrial processes, which includes an input or output channel, wherein the protective circuit as claimed in claim 1 is arranged upstream of one of the input channel and output channel to protect against over-voltages.

* * * * *